(12) United States Patent
Feng

(10) Patent No.: US 11,888,469 B2
(45) Date of Patent: Jan. 30, 2024

(54) POWER DEVICE AND ELECTRICAL APPLIANCE

(71) Applicants: GD MIDEA AIR-CONDITIONING EQUIPMENT CO., LTD., Guangdong (CN); MIDEA GROUP CO., LTD., Guangdong (CN)

(72) Inventor: Yuxiang Feng, Guangdong (CN)

(73) Assignees: GD MIDEA AIR-CONDITIONING EQUIPMENT CO., LTD., Guangdong (CN); MIDEA GROUP CO., LTD., Guangdong (CN)

( * ) Notice: Subject to any disclaimer, the term of this patent is extended or adjusted under 35 U.S.C. 154(b) by 141 days.

(21) Appl. No.: 17/475,620

(22) Filed: Sep. 15, 2021

(65) Prior Publication Data

US 2022/0006454 A1 Jan. 6, 2022

Related U.S. Application Data

(63) Continuation of application No. PCT/CN2019/110973, filed on Oct. 14, 2019.

(30) Foreign Application Priority Data

Mar. 19, 2019 (CN) .......................... 201910208662.0

(51) Int. Cl.
*H03K 17/687* (2006.01)
*H02M 1/088* (2006.01)
(Continued)

(52) U.S. Cl.
CPC ........ *H03K 17/6871* (2013.01); *H02M 1/088* (2013.01); *H02M 3/158* (2013.01);
(Continued)

(58) Field of Classification Search
CPC . H03K 17/6871; H03K 17/693; H02M 1/088; H02M 3/158; H02M 7/003; H02M 7/53871
See application file for complete search history.

(56) References Cited

U.S. PATENT DOCUMENTS 10,199,487 B1 2/2019 Elsayad et al.
2018/0294709 A1* 10/2018 Araki ................... H03K 17/161
(Continued)

FOREIGN PATENT DOCUMENTS

CN 103795248 A 5/2014
CN 206461515 U 9/2017
(Continued)

OTHER PUBLICATIONS

International Search Report dated Jan. 15, 2020 issued in PCT/CN2019/110973.
(Continued)

*Primary Examiner* — Metasebia T Retebo
(74) *Attorney, Agent, or Firm* — Scully, Scott, Murphy & Presser, P.C.

(57) ABSTRACT

A power device and an electrical appliance are provided. The power device has a control input terminal, a first driving circuit and a second driving circuit. When the control input terminal is connected to a high level or a low level, the first driving circuit and the second driving circuit output a high/low level signal in a first voltage range or a high/low level signal in a second voltage range. The first voltage range is different from the second voltage range.

18 Claims, 8 Drawing Sheets

(51) Int. Cl.
  *H02M 3/158* (2006.01)
  *H02M 7/00* (2006.01)
  *H02M 7/5387* (2007.01)
  *H03K 17/693* (2006.01)

(52) U.S. Cl.
  CPC ....... *H02M 7/003* (2013.01); *H02M 7/53871* (2013.01); *H03K 17/693* (2013.01)

(56) References Cited

U.S. PATENT DOCUMENTS

2018/0302082 A1* 10/2018 Shinomiya ........... H03K 17/164
2020/0036279 A1* 1/2020 Li ........................... H02M 1/08

FOREIGN PATENT DOCUMENTS

| CN | 108281940 | A | 7/2018 |
| CN | 208386448 | U | 1/2019 |
| CN | 109525127 | A | 3/2019 |
| CN | 109617383 | A | 4/2019 |
| CN | 109639116 | A | 4/2019 |
| CN | 109768727 | A | 5/2019 |
| CN | 109802554 | A | 5/2019 |
| CN | 109889026 | A | 6/2019 |
| CN | 109921619 | A | 6/2019 |
| IN | 202918196 | U | 5/2013 |
| JP | 2008061339 | A | 3/2008 |
| WO | 2007122281 | A1 | 11/2007 |

OTHER PUBLICATIONS

Chinese Office Action dated Oct. 28, 2019 issued in CN 201910208662.0.
1 Extended European Search Report dated Mar. 17, 2022 received in European Patent Application No. EP 19920433.0.

* cited by examiner

POWER DEVICE AND ELECTRICAL APPLIANCE

CROSS-REFERENCE TO RELATED APPLICATIONS

The present application is a continuation application of PCT International Application No. PCT/CN2019/110973, filed on Oct. 14, 2019, which claims priority from and the benefit of Chinese Patent Application No. 201910208662.0 filed with the China National Intellectual Property Administration on Mar. 19, 2019, the entire content of which is incorporated herein by reference for all purposes. No new matter has been introduced.

FIELD

This present disclosure relates to the technical field of electrical appliance, in particular to a power device and an electrical appliance having the power device.

BACKGROUND

Intelligent Power Module (IPM) is a power driving product (i.e., a power device) that combines power electronics and integrated circuit technology. The intelligent power module integrates power switch devices (such as, a gallium nitride (GaN) device or a silicon (Si) device) and high-voltage integrated circuit (HVIC) tubes, and has built-in fault detection circuits for overvoltage, overcurrent, overheating or the like. However, GaN devices and Si devices have different threshold voltages. Generally, the threshold voltage of a GaN device is lower than that of a Si device. When the GaN device and the Si device are driven by a same high-voltage integrated circuit tube, if a high voltage is supplied to the high-voltage integrated circuit tube to ensure the normal operation of the Si device, the high voltage would break down the gate of the GaN device; and if a low voltage is supplied to the high-voltage integrated circuit tube to ensure the normal operation of the GaN device, the power consumption of the entire Si intelligent power module would be increased, which can cause the malfunction of the Si device.

SUMMARY

The present disclosure and embodiments thereof provide a power device and an electrical appliance having the same.

According to an aspect of the present disclosure, a power device is provided. The power device includes a control input terminal, an upper bridge arm switch tube and a lower bridge arm switch tube, an upper resistor group and a lower resistor group, a first driving circuit and a second driving circuit. The first driving circuit is connected to the control input terminal and connected to the upper bridge arm switch tube through the upper resistor group. The second driving circuit is connected to the control input terminal and connected to the lower bridge arm switch tube through the lower resistor group. The control input terminal is connectable to a high level or a low level. When the control input terminal is connected with the high level, the first driving circuit and the second driving circuit output a high/low level signal in a first voltage range. When the control input terminal is connected with the low level, the first driving circuit and the second driving circuit output a high/low level signal in a second voltage range. The first voltage range is different from the second voltage range.

According to another aspect of the present disclosure, an electrical appliance is provided. The electrical appliance includes a power device and a processor. The processor is connected to the power device. The power device comprises a control input terminal, an upper bridge arm switch tube and a lower bridge arm switch tube, an upper resistor group and a lower resistor group, a first driving circuit and a second driving circuit. The first driving circuit is connected to the control input terminal and connected to the upper bridge arm switch tube through the upper resistor group. The second driving circuit is connected to the control input terminal and connected to the lower bridge arm switch tube through the lower resistor group. The control input terminal is connectable to a high level or a low level. When the control input terminal is connected with the high level, the first driving circuit and the second driving circuit output a high/low level signal in a first voltage range. When the control input terminal is connected with the low level, the first driving circuit and the second driving circuit output a high/low level signal in a second voltage range. The first voltage range is different from the second voltage range.

The power device and electrical appliance in certain embodiments of the present disclosure control the control input terminal of the high-voltage integrated circuit tube to be connected with a high level or a low level. When the control input terminal is connected with a high level, the first driving circuit and the second driving circuit output a high/low level signal in a first voltage range to ensure that the GaN device is fully turned on and that the gate of GaN device is not broken down. When the control input terminal is connected with a low level, the first driving circuit and the second driving circuit output a high/low level signal in a second voltage range different from the first voltage range to ensure that the Si device is fully turned on. Thereby, the adaptability of the GaN intelligent power module and the Si intelligent power module is improved, which ensures that the functions of the GaN and Si intelligent power modules can be executed.

In order to better understand the above technical solutions, the technical solutions are described in detail below in conjunction with the accompanying drawings of specification and specific embodiments.

DETAILED DESCRIPTION OF EMBODIMENTS

Figure 1:
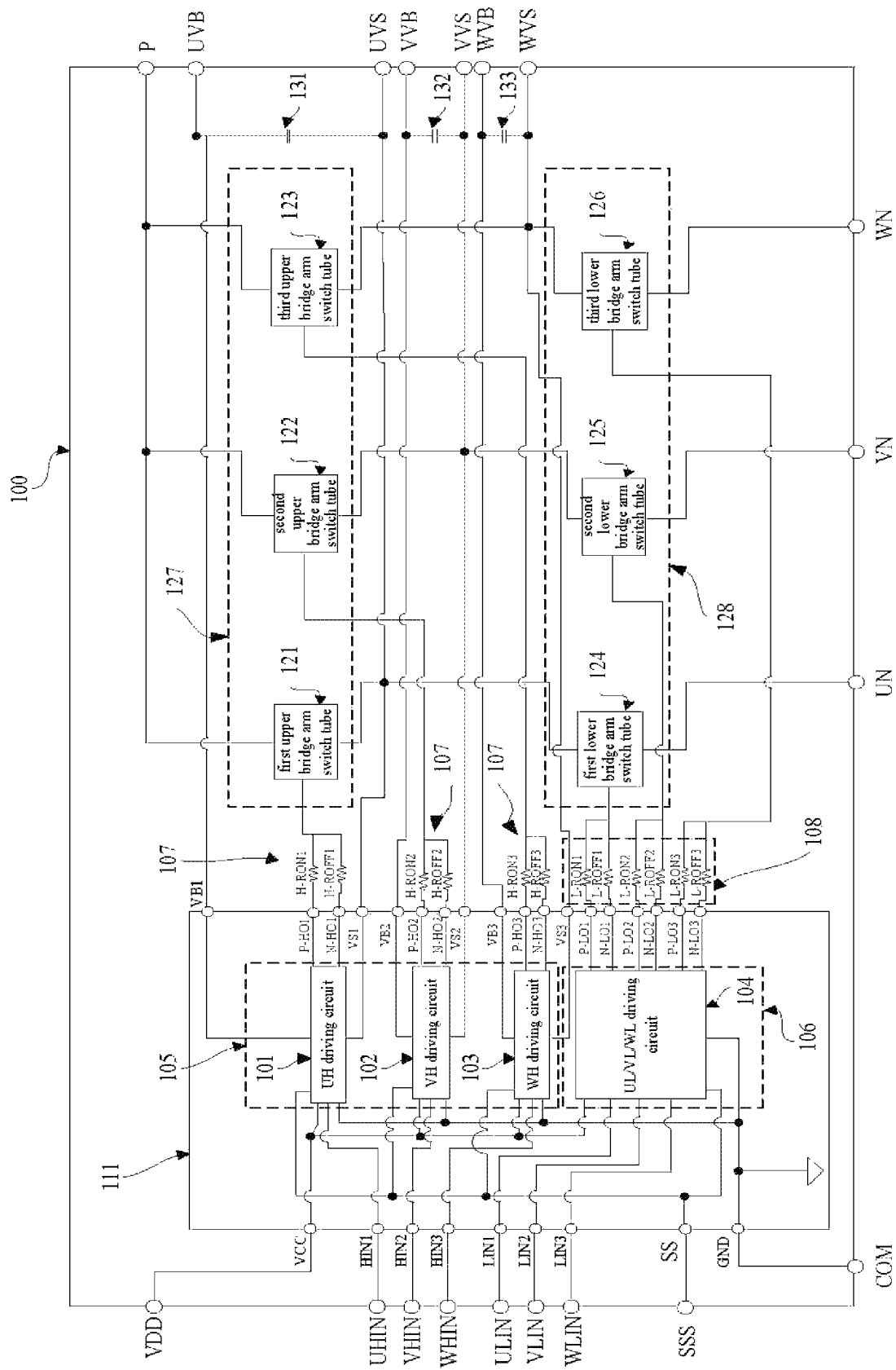
FIG. 1 is a diagram showing the circuit structure of a power device according to an embodiment of the present disclosure.

The embodiments of the present disclosure are described in detail below. Examples of the embodiments are shown in the accompanying drawings, in which the same or similar reference numerals indicate the same or similar elements or elements with the same or similar functions. The following embodiments described with reference to the drawings are exemplary and are only used to explain the present disclosure, which cannot be understood as a limitation to the present disclosure.

In the description of this disclosure, it should be understood that the terms "center", "length", "width", "thickness", "upper", "lower", "top", "inside", "outside" or the like indicate the orientation or positional relationship are based on the orientation or positional relationship shown in the drawings, which is only for the convenience of description and simplifying the description, and does not indicate or imply that the device or element referred to have to have a specific orientation, or be constructed and operated in a specific orientation, therefore they cannot be understood as a limitation of this disclosure. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features.

The following disclosure provides many different embodiments or examples for realizing different structures of the present application. In order to simplify the disclosure of the present application, the components and settings of specific examples are described below. Obviously, they are only examples, and are not intended to limit the present application. The present application may repeat reference numerals and/or reference letters in different examples. Such repetition is for the purpose of simplification and clarity, and does not indicate the relationship between various embodiments and/or settings discussed. In addition, this application provides examples of various specific processes and materials, but those ordinary skilled persons in the art may recognize the application of other processes and/or other materials.

Referring to FIG. 1, the present disclosure in certain embodiments provides a power device 100, comprising a control input terminal SS, an upper bridge arm switch tube 127 and a lower bridge arm switch tube 128, an upper resistor group 107 and a lower resistor group 108, and a first driving circuit 105 and a second driving circuit 106. The first driving circuit 105 is connected to the control input terminal SS and connected to the upper bridge arm switch tube 127 through the upper resistor group 107. The second driving circuit 106 is connected to the control input terminal SS and connected to the lower bridge arm switch tube 128 through the lower resistor group 108. The control input terminal SS can be connected with a high level or a low level. When the control input terminal SS is connected with the high level, the first driving circuit 105 and the second driving circuit 106 output a high/low level signal in a first voltage range, and when the control input terminal SS is connected with the low level, the first driving circuit 105 and the second driving circuit 106 output a high/low level signal in a second voltage range. The first voltage range is different from the second voltage range.

The power device 100 in certain embodiments of the present disclosure controls the control input terminal SS of the high-voltage integrated circuit (HVIC) tube 111 to be connected with a high level or a low level. When the control input terminal SS is connected with a high level, the first driving circuit 105 and the second driving circuit 106 output a high/low level signal in a first voltage range to ensure that the GaN device is fully turned on and the gate of GaN device is not broken down. When the control input terminal SS is connected with a low level, the first driving circuit 105 and the second driving circuit 106 output a high/low level signal in a second voltage range different from the first voltage range to ensure that the Si device is fully turned on. Thereby, the adaptability of the GaN intelligent power module and the Si intelligent power module is improved, which ensures the functions of the GaN and Si intelligent power modules to be executed. In addition, the power supply voltage of the power device 100 remains unchanged at 15V and the peripheral circuit does not need to be modified, thus the power consumption of the HVIC tube 111 does not substantially increase. A same kind of HVIC tube 111 drives the GaN device and Si device, thereby there is no risk of mixing HVIC tubes 111 during the production process, which facilitates material organization and reduces material costs.

In practice, as the requirements for system energy consumption continue to increase, especially in the air-conditioning industry, the power consumption of intelligent power module has become the main source of power consumption for variable frequency electronic control of inverter air conditioners. Thus, how to reduce the power consumption of intelligent power modules has become an important factor for the further promotion and application of intelligent power modules and even inverter air conditioners. For this, the present disclosure proposes a power device 100 with high adaptability, which can improve the adaptability of GaN intelligent power modules and Si intelligent power modules, thus ensuring that the functions of the GaN and Si intelligent power modules are executed.

In order to better understand the following technical solutions, the exemplary embodiments of the present disclosure are described in more detail below with reference to the accompanying drawings. Although the drawings show exemplary embodiments of the present disclosure, it should be understood that the present disclosure can be implemented in various forms and should not be limited by the embodiments herein. On the contrary, these embodiments are provided for a more thorough understanding of the present disclosure and to fully convey the scope of the present disclosure to those skilled in the art.

Referring to FIG. 1, the power device in certain embodiments of the present disclosure includes a control input terminal SS, an upper bridge arm switch tube 127 and a lower bridge arm switch tube 128, an upper resistor group 107 and a lower resistor group 108, a first driving circuit 105 and a second driving circuit 106.

The upper bridge arm switch tube 127 includes a first upper bridge arm switch tube 121, a second upper bridge arm switch tube 122 and a third upper bridge arm switch tube 123. The lower bridge arm switch tube 128 includes a first lower bridge arm switch tube 124, a second lower bridge arm switch tube 125 and a third lower bridge arm switch tube 126.

The upper resistor group 107 includes a first upper switch resistor, a second upper switch resistor and a third upper switch resistor. The first upper switch resistor includes a first upper turn-on resistor H-RON1 and a first upper turn-off resistor H-ROFF1. The second upper switch resistor includes a second upper turn-on resistor H-RON2 and a second upper turn-off resistor H-ROFF2. The third upper switch resistor includes a third upper turn-on resistor H-RON3 and a third upper turn-off resistor H-ROFF3. The lower resistor group 108 includes a first lower switch resistor, a second lower switch resistor and a third lower switch resistor. The first lower switch resistor includes a first lower turn-on resistor L-RON1 and a first lower turn-off resistor L-ROFF1. The second lower switch resistor includes a second lower turn-on resistor L-RON2 and a second lower turn-off resistor L-ROFF2. The third lower switch resistor includes a third lower turn-on resistor L-RON3 and a third lower turn-off resistor L-ROFF3.

The first driving circuit 105 includes a UH (a first phase upper) driving circuit 101, a VH (a second phase upper) driving circuit 102 and a WH (a third phase upper) driving circuit 103. The second driving circuit 106 includes a UL/VL/WL (lower) driving circuit 104. The control input terminal SS is connected to each of the UH driving circuit 101, the VH driving circuit 102, the WH driving circuit 103 and the UL/VL/WL driving circuit 104. In this embodiment, the UH driving circuit 101, the VH driving circuit 102, the WH driving circuit 103 and the UL/VL/WL driving circuit 104 can be driving circuits inside the electrical appliance 1000, for example, a three-phase driving circuit for a compressor of an air conditioner. The UH driving circuit 101 is connected to the UL driving circuit 104, the VH driving circuit 102 is connected to the VL driving circuit 104, and the WH driving circuit 103 is connected to the WL driving circuit 104.

The UH driving circuit 101 is connected to and configured to drive the first upper bridge arm switch tube 121 through the first upper switch resistor, in which the first upper turn-on resistor H-RON1 and the first upper turn-off resistor H-ROFF1 in the first upper switch resistor are connected in parallel. The VH driving circuit 102 is connected to and configured to drive the second upper bridge arm switch tube 122 through the second upper switch resistor, in which the second upper turn-on resistor H-RON2 and the second upper turn-off resistor H-ROFF2 in the second upper switch resistor are connected in parallel. The WH driving circuit 103 is connected to and configured to drive the third upper bridge arm switch tube 123 through the third upper switch resistor, in which the third upper turn-on resistor H-RON3 and the third upper turn-off resistor H-ROFF3 in the third upper switch resistor are connected in parallel.

The UL/VL/WL driving circuit 104 is connected to and configured to drive the first lower bridge arm switch tube 124 through the first lower switch resistor, in which the first lower turn-on resistor L-RON1 and the first lower turn-off resistor L-ROFF1 in the first lower switch resistor are connected in parallel. The UL/VL/WL driving circuit 104 is connected to and configured to drive the second lower bridge arm switch tube 125 through the second lower switch resistor, in which the second lower turn-on resistor L-RON2 and the second lower turn-off resistor L-ROFF2 in the second lower switch resistor are connected in parallel. The UL/VL/WL driving circuit 104 is connected to and configured to drive the third lower bridge arm switch tube 126 through the third lower switch resistor, in which the third lower turn-on resistor L-RON3 and the third lower turn-off resistor L-ROFF3 in the third lower switch resistor are connected in parallel.

The UH driving circuit 101, the VH driving circuit 102, the WH driving circuit 103 and the UL/VL/WL driving circuit 104 are integrated inside the HVIC tube 111. The VCC terminal of the HVIC tube 111 is configured to serve as a VDD positive terminal of a low-voltage power supply of the power device 100, and a voltage of the power supply at the VDD terminal is 15V. The control input terminal SS of the HVIC tube 111 is configured to serve as the SSS terminal of the power device 100. The VCC terminal is connected to a positive terminal of the power supply of the UH driving circuit 101, the VH driving circuit 102, the WH driving circuit 103 and the UL/VL/WL driving circuit 104 inside the HVIC tube 111.

The HIN1 terminal of the HVIC tube 111 is configured to serve as the input terminal UHIN of the U-phase upper bridge arm of the power device 100 and is connected to the input terminal of the UH driving circuit 101 inside the HVIC tube 111. The HIN2 terminal of the HVIC tube 111 is configured to serve as the input terminal VHIN of the V-phase upper bridge arm of the power device 100 and is connected to the input terminal of the VH driving circuit 102 inside the HVIC tube 111. The HIN3 terminal of the HVIC tube 111 is configured to serve as the input terminal WHIN of the W-phase upper bridge arm of the power device 100 and is connected to the input terminal of the WH driving circuit 103 inside the HVIC tube 111. The LIN1 terminal of the HVIC tube 111 is configured to serve as the input terminal ULIN of the U-phase lower bridge arm of the power device 100 and is connected to the first input terminal of the UL/VL/WL driving circuit 104 inside the HVIC tube 111. The LIN2 terminal of the HVIC tube 111 is configured to serve as the input terminal VLIN of the V-phase lower bridge arm of the power device 100 and is connected to the second input terminal of the UL/VL/WL driving circuit 104 inside the HVIC tube 111. The LIN3 terminal of the HVIC tube 111 is configured to serve as the input terminal WLIN of the W-phase lower bridge arm of the power device 100 and is connected to the third input terminal of the UL/VL/WL driving circuit 104 inside the HVIC tube 111.

The six input terminals of the U-phase, V-phase and W-phase of the power device 100 receive an input signal at 0V or 5V. The GND terminal of the HVIC tube 111 is configured to serve as a negative terminal COM of the low-voltage power supply of the power device 100, and is connected to a negative terminal of the power supply of the UH driving circuit 101, the VH driving circuit 102, the WH driving circuit 103 and the UL/VL/WL driving circuit 104.

The VB1 terminal of the HVIC tube 111 is connected to a positive terminal of a high-voltage power supply of the UH driving circuit 101 inside the HVIC tube 111, and the VB1 terminal of the HVIC tube 111 is connected to one end of the capacitor 131 and is configured to serve as a positive terminal UVB of U-phase high-voltage power supply of the power device 100 outside the HVIC tube 111.

The P-HO1 terminal and the N-HO1 terminal of the HVIC tube 111 are connected to the output terminal of the UH driving circuit 101 inside the HVIC tube 111, and the P-HO1 terminal and the N-HO1 terminal are respectively connected to the first upper turn-on resistor H-RON1 and the first upper turn-off resistor H-ROFF1 outside the HVIC tube 111. The first upper turn-on resistor H-RON1 and the first upper turn-off resistor H-ROFF1 are converged at the other end to be connected to the control electrode of the U-phase upper bridge arm switch tube (first upper bridge arm switch tube 121).

The VS1 terminal of the HVIC tube 111 is connected to a negative terminal of a high-voltage power supply of the UH driving circuit 101 inside the HVIC tube 111, and the VS1 terminal of the HVIC tube 111 is connected to an output negative electrode of the U-phase upper bridge arm switch tube (first upper bridge arm switch tube 121), an output positive electrode of the U-phase lower bridge arm switch tube (first lower bridge arm switch tube 124) and the other end of the capacitor 131, and is configured to serve as a negative terminal UVS of U-phase high-voltage power supply of the power device 100 outside the HVIC tube 111.

The VB2 terminal of the HVIC tube 111 is connected to a positive terminal of a high-voltage power supply of the VH driving circuit 102 inside the HVIC tube 111, and the VB2 terminal of the HVIC tube 111 is connected to one end of the capacitor 132 and is configured to serve as a positive terminal VVB of U-phase high-voltage power supply of the power device 100 outside the HVIC tube 111.

The P-HO2 terminal and N-HO2 terminal of the HVIC tube 111 are connected to the output terminal of the VH driving circuit 102 inside the HVIC tube 111, and the P-HO2 terminal and the N-HO2 terminal are respectively connected to the second upper turn-on resistor H-RON2 and the second upper turn-off resistor H-ROFF2 outside the HVIC tube 111. The second upper turn-on resistor H-RON2 and the second upper turn-off resistor H-ROFF2 are converged at the other end to be connected to the control electrode of the V-phase upper bridge arm switch tube (second upper bridge arm switch tube 122).

The VS2 terminal of the HVIC tube 111 is connected to a negative terminal of a high-voltage power supply of the VH driving circuit 102 inside the HVIC tube 111, and the VS2 terminal of the HVIC tube 111 is connected to an output negative electrode of the V-phase upper bridge arm switch tube (second upper bridge arm switch tube 122), an output positive electrode of the V-phase lower bridge arm switch tube (second lower bridge arm switch tube 125) and the other end of the capacitor 132, and is configured to serve as a negative terminal VVS of V-phase high-voltage power supply of the power device 100 outside the HVIC tube 111.

The VB3 terminal of the HVIC tube 111 is connected to a positive terminal of a high-voltage power supply of the WH driving circuit 103 inside the HVIC tube 111, and the VB3 terminal of the HVIC tube 111 is connected to one end of the capacitor 133 and is configured to serve as a positive terminal WVB of W-phase high-voltage power supply of the power device 100 outside the HVIC tube 111.

The P-HO3 terminal and N-HO3 terminal of the HVIC tube 111 are connected to the output terminal of the WH driving circuit 103 inside the HVIC tube 111, and the P-HO3 terminal and the N-HO3 terminal are respectively connected to the third upper turn-on resistor H-RON3 and the third upper turn-off resistor H-ROFF3 outside the HVIC tube 111. The third upper turn-on resistor H-RON3 and the third upper turn-off resistor H-ROFF3 are converged at the other end to be connected to the control electrode of the W-phase upper bridge arm switch tube (third upper bridge arm switch tube 123).

The VS3 terminal of the HVIC tube 111 is connected to a negative terminal of a high-voltage power supply of the WH driving circuit 103 inside the HVIC tube 111, and the VS3 terminal of the HVIC tube 111 is connected to an output negative electrode of the W-phase upper bridge arm switch tube (third upper bridge arm switch tube 123), an output positive electrode of the W-phase lower bridge arm switch tube (third lower bridge arm switch tube 126) and the other end of the capacitor 133, and is configured to serve as a negative terminal WVS of W-phase high-voltage power supply of the power device 100 outside the HVIC tube 111.

The P-LO1 terminal and N-LO1 terminal of the HVIC tube 111 are respectively connected to the first lower turn-on resistor L-RON1 and the first lower turn-off resistor L-ROFF1, and the first lower turn-on resistor L-RON1 and the first lower turn-off resistor L-ROFF1 are converged at the other end to be connected to the control electrode of the U-phase lower bridge arm switch tube (the first lower bridge arm switch tube 124).

The P-LO2 terminal and N-LO2 terminal of the HVIC tube 111 are respectively connected to the second lower turn-on resistor L-RON2 and the second lower turn-off resistor L-ROFF2, and the second lower turn-on resistor L-RON2 and the second lower turn-off resistor L-ROFF2 are converged at the other end to be connected to the control electrode of the V-phase lower bridge arm switch tube (the second lower bridge arm switch tube 125).

The P-LO3 terminal and N-LO3 terminal of the HVIC tube 111 are respectively connected to the third lower turn-on resistor L-RON3 and the third lower turn-off resistor L-ROFF3, and the third lower turn-on resistor L-RON3 and the third lower turn-off resistor L-ROFF3 are converged at the other end to be connected to the control electrode of the W-phase lower bridge arm switch tube (the third lower bridge arm switch tube 126).

The output negative electrode of the U-phase lower bridge arm switch tube (the first lower bridge arm switch tube 124) is configured to serve as a reference terminal UN of U-phase low voltage of the power device 100. The output negative electrode of the V-phase lower bridge arm switch tube (the second lower bridge arm switch tube 125) is configured to serve as a reference terminal VN of V-phase low voltage of the power device 100. The output negative electrode of the W-phase lower bridge arm switch tube (the third lower bridge arm switch tube 126) is configured to serve as a reference terminal WN of W-phase low voltage of the power device 100.

An output positive electrode of the U-phase upper bridge arm switch tube (the first upper bridge arm switch tube 121), an output positive electrode of the V-phase upper bridge arm switch tube (the second upper bridge arm switch tube 122) and an output positive electrode of the W-phase upper bridge arm switch tube (the third upper bridge arm switch tube 123)

are connected and serve as a high-voltage input terminal P of the power device 100, in which the terminal P is connected with 300V.

In certain embodiments of the present disclosure, the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) can be a combination of an IGBT tube (Si device) and an FRD tube in parallel, or a combination of an IGBT tube and a Schottky Barrier Diode (GaN SBD), or a metal-oxide-semiconductor (GaN MOS, GaN device), or a combination of a GaN MOS tube and a Fast Recovery Diode (FRD), or a combination of a GaN MOS tube and a GaN SBD tube, which can be selected according to actual needs and is not particularly limited.

When the control input terminal SS is connected with a high level, the P-HO1, N-HO1, P-HO2, N-HO2, P-HO3, N-HO3, P-LO1, N-LO1, P-LO2, N-LO2, P-LO3 and N-LO3 output a high/low level signal of 0V to 3V. That is, when the control input terminal SS is connected with a high level, the UH driving circuit 101, the VH driving circuit 102, the WH driving circuit 103 and the UL/VL/WL driving circuit 104 output a high/low level signal in a first voltage range, in which the first voltage range is in the range of 0V to 3V.

When the control input terminal SS is connected with a low level, the P-HO1, N-HO1, P-HO2, N-HO2, P-HO3, N-HO3, P-LO1, N-LO1, P-LO2, N-LO2, P-LO3 and N-LO3 output a high/low level signal of 0V to 15V. That is, when the control input terminal SS is connected with a low level, the UH driving circuit 101, the VH driving circuit 102, the WH driving circuit 103 and the UL/VL/WL driving circuit 104 output a high/low level signal in a second voltage range, in which the second voltage range is in the range of 0V to 15V.

Figure 2:
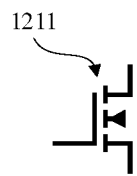
FIG. 2 is a schematic diagram showing the structure of an upper bridge arm switch tube and a lower bridge arm switch tube according to an embodiment of the present disclosure.
Figure 3:
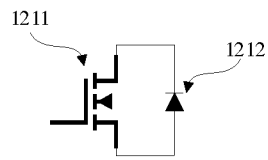
FIG. 3 is a schematic diagram showing the structure of an upper bridge arm switch tube and a lower bridge arm switch tube according to another embodiment of the present disclosure.
Figure 4:
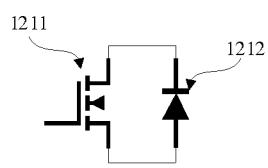
FIG. 4 is a schematic diagram showing the structure of an upper bridge arm switch tube and a lower bridge arm switch tube according to another embodiment of the present disclosure.

According to an embodiment of the present disclosure, the control input terminal SS is connected with a high level, when the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) each contain a GaN device (that is, the upper bridge arm switch tube and the lower bridge arm switch tube each are GaN MOS mode in FIG. 2, or a combination mode of GaN MOS and Si FRD in FIG. 3, or a combination mode of GaN MOS and GaN SBD in FIG. 4). The control input terminal SS is connected with a low level, when the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) each contain a Si device (that is, the upper bridge arm switch tube and the lower bridge arm switch tube each are a combination mode of Si IGBT and Si FRD in FIG. 5, or a combination mode of Si IGBT and GaN SBD in FIG. 6).

Referring to FIGS. 1-7 in combination, the power device 100 further includes a controller 130. When the control input terminal SS is set to a high level, the controller 130 can control the control input terminal SS to be connected with the high level. Similarly, when the control input terminal SS is set to a low level, the controller 130 can control the control input terminal SS to be connected with the low level. It can be understood that the controller 130 may include a digital circuit for outputting a high level or a low level, and may also include a flip-flop, but is not limited thereto. The controller 130 may be installed inside the HVIC tube 111, for example, between the control input terminal SS and the terminal SSS, or the like. The controller 130 may be installed outside the HVIC tube 111, for example, near the control input terminal SS, or the like. The controller 130 may be installed on the microprocessor of the electric appliance 1000, referring to FIG. 16.

In another embodiment, referring to FIGS. 8 to 11 in combination, the power device 100 further includes a first connecting portion 116 and a second connecting portion 117. The first connecting portion 116 is configured to connect the VCC terminal and the VDD terminal, and the second connecting portion 117 is configured to connect the GND terminal and the COM terminal. When the control input terminal SS is set to be a high level, the control input terminal SS is connected to the VCC terminal through a bonding wire, referring to FIGS. 8 and 9. When the control input terminal SS is set to be a low level, the control input terminal SS is connected to the GND terminal through a bonding wire, referring to FIGS. 10 and 11.

The power device 100 in certain embodiments of the present disclosure controls the control input terminal SS of the HVIC tube 111 to be connected with a high level or a low level. When the control input terminal SS is connected with a high level, the first driving circuit 105 and the second driving circuit 106 output a high/low level signal in a first voltage range (0V-3V) to ensure that the GaN device is fully turned on. When the control input terminal SS is connected with a low level, the first driving circuit 105 and the second driving circuit 106 output a high/low level signal in a second voltage range (0V-15V) to ensure that the Si device is fully turned on and the gate of Si device is not broken down. Thereby, the adaptability of the GaN intelligent power module and the Si intelligent power module is improved, which ensures the functions of the GaN and Si intelligent power modules to be executed. Besides, the power supply voltage of the power device 100 remains unchanged at 15V and the peripheral circuit does not need to be modified, thus the power consumption of the HVIC tube 111 does not substantially increase. A same kind of HVIC tube 111 drives the GaN device and Si device, thus there is no risk of mixing HVIC tubes 111 during the production process, which facilitates material organization and reduces material costs. In addition, turn-on resistors (the first upper turn-on resistor H-RON1, the second upper turn-on resistor H-RON2, the third upper turn-on resistor H-RON3, the first lower turn-on resistor L-RON1, the second lower turn-on resistor L-RON2 and the third lower turn-on resistor L-RON3) and turn-off resistors (the first upper turn-off resistor H-ROFF1, the second upper turn-off resistor H-ROFF2, the third upper turn-off resistor H-ROFF3, the first lower turn-off resistor L-ROFF1, the second lower turn-off resistor L-ROFF2 and the third lower turn-off resistor L-ROFF3) are adopted in the present disclosure, thus output of the driving circuits (UH driving circuit 101, VH driving circuit 102, WH driving circuit 103 and UL/VL/WL driving circuit 104) can independently switch on and off the bridge arm switch tubes (the upper bridge arm switch tube 127 and the lower bridge arm switch tube 128), thereby ensuring the reliable switch on and off of the GaN device and Si device, which is important for GaN device with a lower voltage threshold.

In certain embodiments of the present disclosure, the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) have same structures. Thus, taking the U-phase upper bridge arm switch tube (first upper bridge arm switch tube 121) as an example, the U-phase upper bridge arm switch tube (first upper bridge arm switch tube 121) may have five forms of structure.

Referring to FIG. 2, the U-phase upper bridge arm switch tube (first upper bridge arm switch tube 121) may be a GaN MOS mode. A drain of the GaN MOS tube 1211 is configured to serve as an output positive electrode of the U-phase upper bridge arm switch tube (the first upper bridge arm switch tube 121). A source of the GaN MOS tube 1211 is configured to serve as an output negative electrode of the U-phase upper bridge arm switch tube (the first upper bridge arm switch tube 121). A gate of the GaN MOS tube 1211 is configured to serve as a control electrode of the U-phase upper bridge arm switch tube (the first upper bridge arm switch tube 121).

Referring to FIG. 3, the U-phase upper bridge arm switch tube (first upper bridge arm switch tube 121) may be a combination mode of GaN MOS and Si FRD. A drain of the GaN MOS tube 1211 is connected to a cathode of the Si FRD tube 1212, and is configured to serve as an output positive electrode of the U-phase upper bridge arm switch tube (the first upper bridge arm switch tube 121). A source of the GaN MOS tube 1211 is connected to an anode of the Si FRD tube 1212, and is configured to serve as an output negative electrode of the U-phase upper bridge arm switch tube (the first upper bridge arm switch tube 121). A gate of the GaN MOS tube 1211 is configured to serve as a control electrode of the U-phase upper bridge arm switch tube (the first upper bridge arm switch tube 121).

Referring to FIG. 4, the U-phase upper bridge arm switch tube (the first upper bridge arm switch tube 121) may be a combination mode of GaN MOS and GaN SBD. A drain of the GaN MOS tube 1211 is connected to a cathode of the GaN SBD tube 1212, and is configured to serve as an output positive electrode of the U-phase upper bridge arm switch tube (the first upper bridge arm switch tube 121). A source of the GaN MOS tube 1211 is connected to an anode of the GaN SBD tube 1212, and is configured to serve as an output negative electrode of the U-phase upper bridge arm switch tube (the first upper bridge arm switch tube 121). A gate of the Si IGBT tube 1211 is configured to serve as a control electrode of the U-phase upper bridge arm switch tube (the first upper bridge arm switch tube 121).

Figure 5:
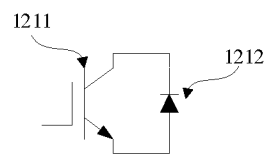
FIG. 5 is a schematic diagram showing the structure of an upper bridge arm switch tube and a lower bridge arm switch tube according to a further embodiment of the present disclosure.

Referring to FIG. 5, the U-phase upper bridge arm switch tube (the first upper bridge arm switch tube 121) may be a combination mode of Si IGBT and Si FRD. A collector of the Si IGBT tube 1211 is connected to a cathode of the Si FRD tube 1212 and is configured to serve as an output positive electrode of the U-phase upper bridge arm switch tube (the first upper bridge arm switch tube 121). An emitter of the Si IGBT tube 1211 is connected to an anode of the Si FRD tube 1212 and is configured to serve as an output negative electrode of the U-phase upper bridge arm switch tube (the first upper bridge arm switch tube 121). A gate of the Si IGBT tube 1211 is configured to serve as a control electrode of the U-phase upper bridge arm switch tube (the first upper bridge arm switch tube 121).

Figure 6:
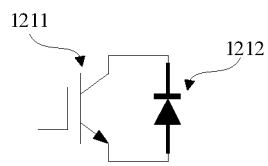
FIG. 6 is a schematic diagram showing the structure of an upper bridge arm switch tube and a lower bridge arm switch tube according to a still further embodiment of the present disclosure.
Figure 7:
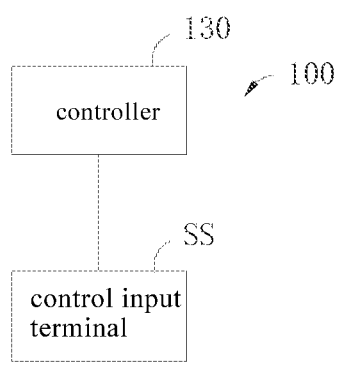
FIG. 7 is a schematic diagram of the modules of a power device according to an embodiment of the present disclosure.
Figure 8:
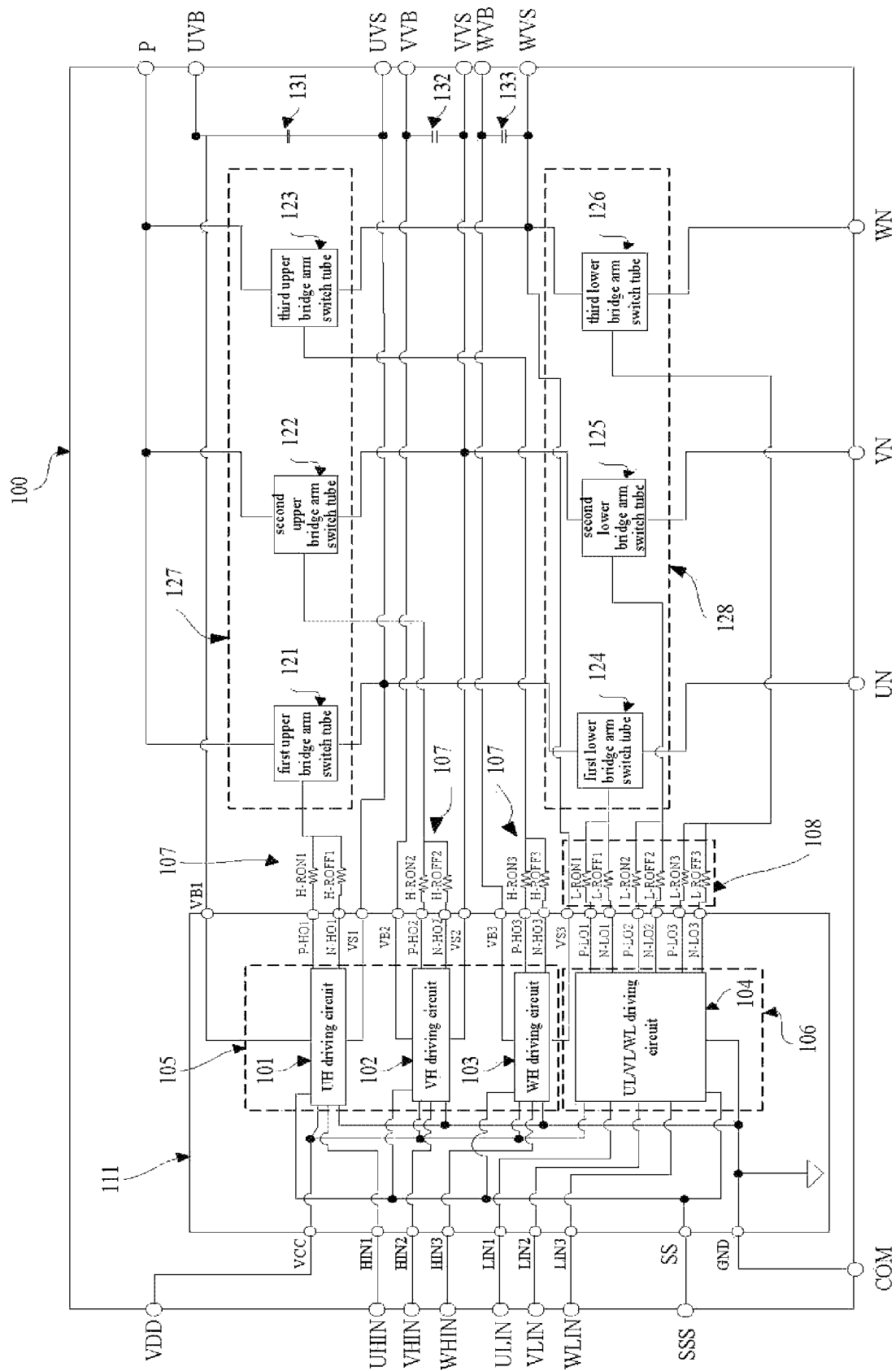
FIG. 8 is a diagram showing the circuit structure of a power device according to an embodiment of the present disclosure, in which a control input terminal SS is connected to a power supply through a bonding wire.
Figure 9:
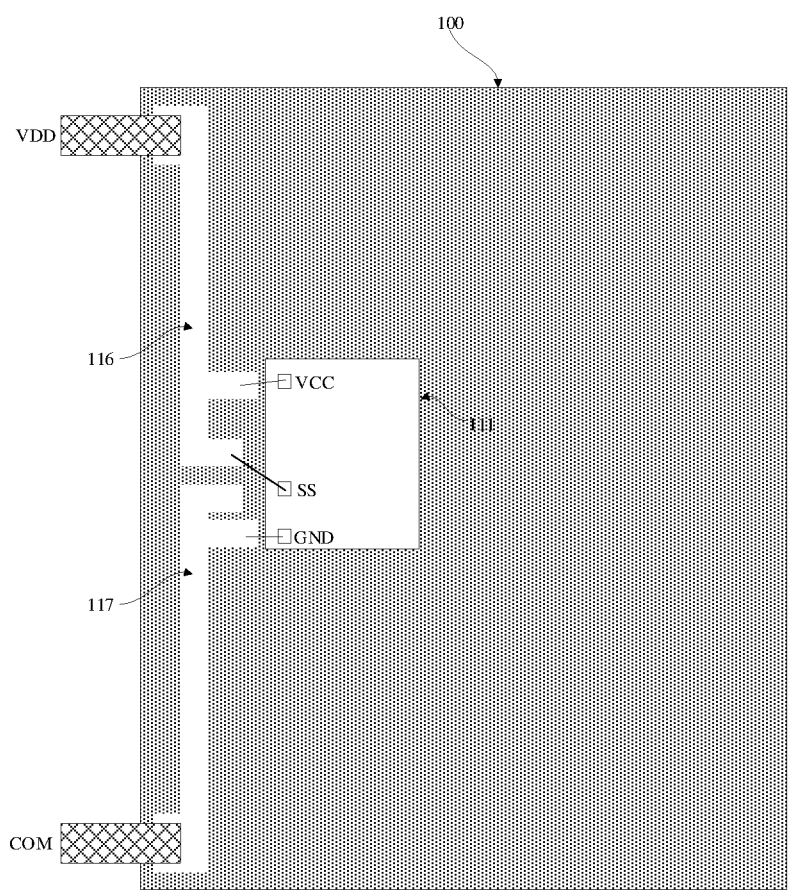
FIG. 9 is a schematic diagram showing a power device according to an embodiment of the present disclosure, in which a control input terminal SS is connected to a power supply through a bonding wire.
Figure 10:
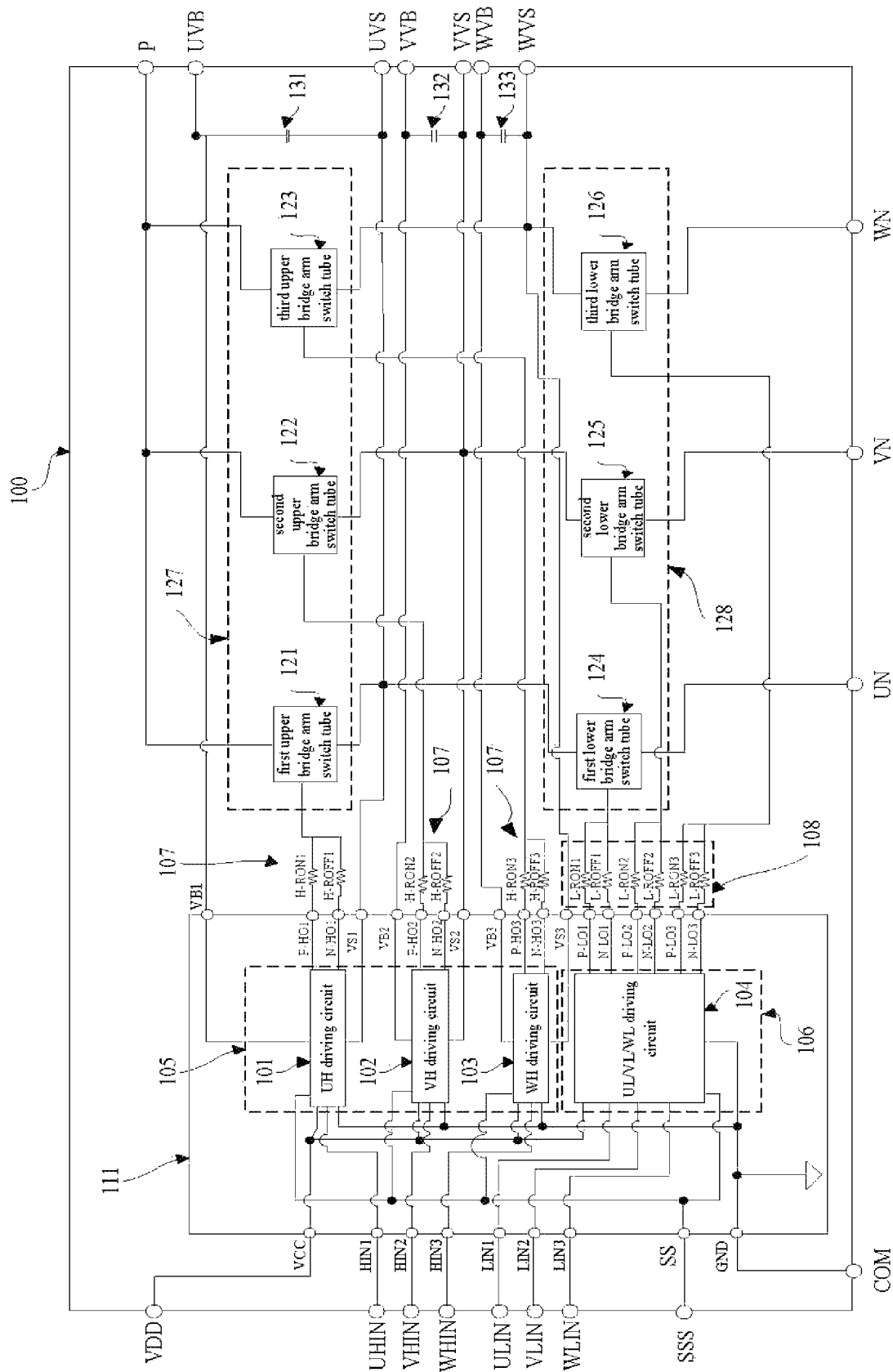
FIG. 10 is a diagram showing the circuit structure of a power device according to an embodiment of the present disclosure, in which a control input terminal SS is connected to ground through a bonding wire.
Figure 11:
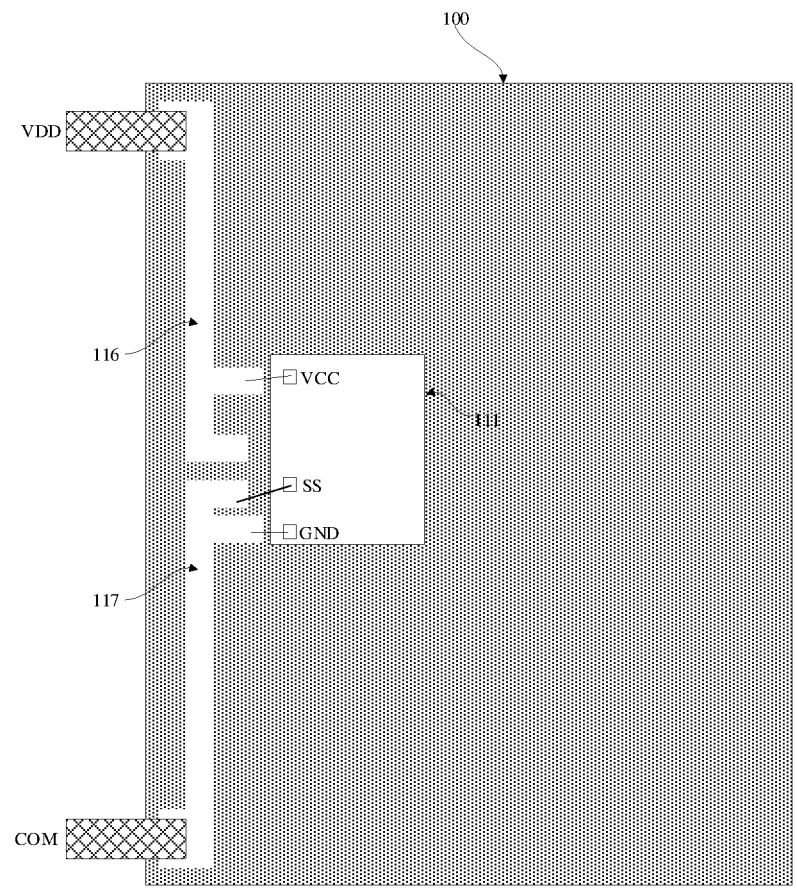
FIG. 11 is a schematic diagram showing a power device according to an embodiment of the present disclosure, in which a control input terminal SS is connected to ground through a bonding wire.

Referring to FIG. 6, the U-phase upper bridge arm switch tube (the first upper bridge arm switch tube 121) may be a combination mode of Si IGBT and GaN SBD. A collector of the Si IGBT tube 1211 is connected to a cathode of the GaN SBD tube 1212 and is configured to serve as an output positive electrode of the U-phase upper bridge arm switch tube (the first upper bridge arm switch tube 121). An emitter of the Si IGBT tube 1211 is connected to an anode of the GaN SBD tube 1212 and is configured to serve as an output negative electrode of the U-phase upper bridge arm switch tube (the first upper bridge arm switch tube 121). A gate of the Si IGBT tube 1211 is configured to serve as a control electrode of the U-phase upper bridge arm switch tube (the first upper bridge arm switch tube 121).

It can be understood that the structures of the second upper bridge arm switch tube 122, the third upper bridge arm switch tube 123, the first lower bridge arm switch tube 124, the second lower bridge arm switch tube 125 and the third lower bridge arm switch tube 126 are referred to the structure of the first upper bridge arm switch tube 121, which can be any one of the five forms selected from GaN MOS, a combination of GaN MOS and Si FRD, a combination of GaN MOS and GaN SBD, a combination of Si IGBT and Si FRD, and a combination of Si IGBT and GaN SBD. The specific structure is the same as that of the first upper bridge arm switch tube 121, which is not repeated.

In this embodiment, the structures of the UH driving circuit 101, the VH driving circuit 102 and the WH driving circuit 103 are identical. The UH driving circuit 101 is taken as an example for description.

Figure 12:
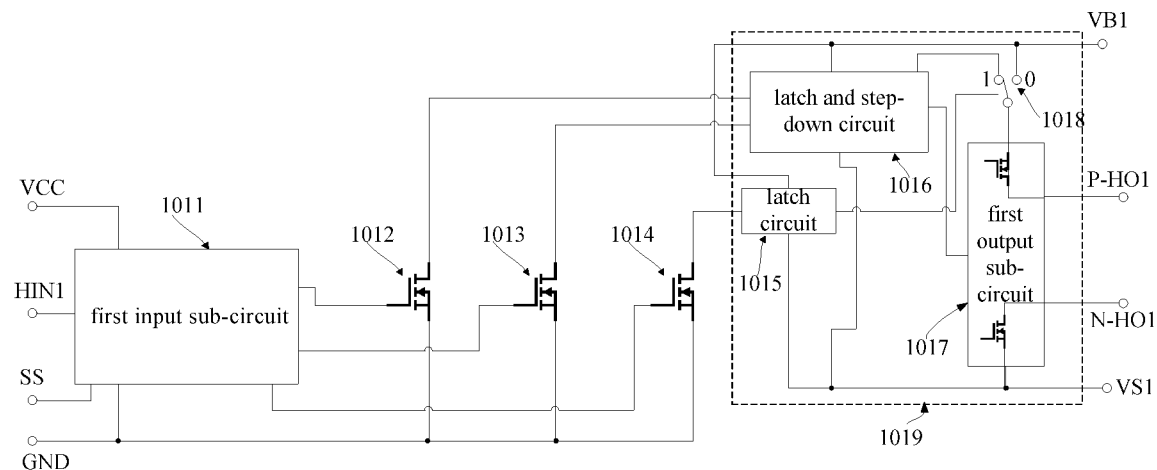
FIG. 12 is a schematic diagram of a UH driving circuit according to an embodiment of the present disclosure.

Referring to FIG. 12, the UH driving circuit 101 inside includes a first input sub-circuit 1011, a first switch tube 1012, a second switch tube 1013, a third switch tube 1014, and a first voltage output sub-circuit 1019. The first input sub-circuit 1011 includes a first output terminal, a second output terminal and a third output terminal. The first output terminal is connected to the first switch tube 1012. The second output terminal is connected to the second switch tube 1013. The third output terminal is connected to the third switch tube 1014.

The first voltage output sub-circuit 1019 includes a latch and step-down module 1016, a first switching module 1018, a latch module 1015, and a first output sub-circuit 1017. The latch and step-down module 1016 is connected to the first switch tube 1012 and the second switch tube 1013. The first switching module 1018 is connected to the latch and step-down module 1016 and a power supply respectively. The latch module 1015 is connected to the third switch tube 1014.

A first input terminal of the latch and step-down module 1016 is connected to a drain of the first switch tube 1012. A second input terminal of the latch and step-down module 1016 is connected to a drain of the second switch tube 1013. A first output terminal of the latch and step-down module 1016 is connected to a selection terminal 1 of the first switching module 1018 (for example, an analog switch). A second output terminal of the latch and step-down module 1016 is connected to an input terminal of the first output sub-circuit 1017.

An input terminal of the latch module 1015 is connected to a drain of the third switch tube 1014. An output terminal of the latch module 1015 is connected to a control terminal of the first switching module 1018. When the input terminal of the latch module 1015 is connected with a low level signal, the output terminal of the latch module 1015 outputs a high level. When the input terminal of the latch module 1015 is connected with a high level signal, the output terminal of the latch module 1015 outputs a low level. A fixed terminal of the first switching module 1018 is connected to a positive terminal of the power supply of the first output sub-circuit 1017.

When the control input terminal SS is connected with the high level, the first output terminal, the second output terminal and the third output terminal of the first input sub-circuit 1011 output trigger pulses, and the first switch tube 1012, the second switch tube 1013 and the third switch tube 1014 are each turned on. The first voltage output sub-circuit 1019 outputs a high/low level signal in the first voltage range (0V-3V). That is, the latch module 1015 is able to control an action of the first switching module 1018 to take an output voltage of the latch and step-down module 1016 as an output voltage of the first voltage output sub-circuit 1019.

The control input terminal SS is connected to the first input sub-circuit 1011. When the control input terminal SS is at a low level, the first output terminal and the second output terminal of the first input sub-circuit 1011 output trigger pulses. The first switch tube 1012 and the second switch tube 1013 are turned on, but the third switch tube 1014 is turned off. The first voltage output sub-circuit 1019 outputs a high/low level signal in the second voltage range (0V-15V). That is, the latch module 1015 is able to control an action of the first switching module 1018 to take a voltage of the power supply as an output voltage of the first voltage output sub-circuit 1019.

The VCC terminal is connected to a positive terminal of the power supply of the first input sub-circuit 1011. The HIN1 terminal is connected to the input terminal of the first input sub-circuit 1011. The control input terminal SS is connected to the control terminal of the first input sub-circuit 1011. The first output terminal of the first input sub-circuit 1011 is connected to the gate of the first switch tube 1012 (for example, a high-voltage DMOS tube). The second output terminal of the first input sub-circuit 1011 is connected to the gate of the second switch tube 1013 (for example, a high-voltage DMOS tube). The third output terminal of the first input sub-circuit 1011 is connected to the gate of the third switch tube 1014 (for example, a high-voltage DMOS tube).

The GND terminal is connected to each of the negative terminal of the power supply of the first input sub-circuit 1011, the substrate and source of the first switch tube 1012, the substrate and source of the second switch tube 1013, and the substrate and source of the third switch tube 1014.

The VB1 is connected to the positive terminal of the power supply of the latch module 1015, the positive terminal of the power supply of the latch and step-down module 1016 and the selection terminal 0 of the first switching module 1018. The VS1 terminal is connected to each of the negative terminal of the power supply of the latch module 1015, the negative terminal of the power supply of the latch and step-down module 1016 and the negative terminal of the power supply of the first output sub-circuit 1017. The P-HO1 and N-HO1 are connected to the output terminal of the first output sub-circuit 1017.

The function of the first input sub-circuit 1011 is described as follows: when the input terminal signal of the first input sub-circuit 1011 is at a rising edge, the first output terminal of the first input sub-circuit 1011 outputs a pulse signal with a pulse width of about 300 ns; when the input terminal signal of the first input sub-circuit 1011 is at a falling edge, the second output terminal of the first input sub-circuit 1011 outputs a pulse signal with a pulse width of about 300 ns; and when the control input terminal SS of the first input sub-circuit 1011 is at a high level, the third output terminal of the first input sub-circuit 1011 outputs a pulse signal with a pulse width of about 300 ns.

The function of the latch module 1015 is described as follows: when the input terminal signal of the latch module 1015 is connected with a low level, the output terminal of the latch module 1015 outputs a high level; and when the input terminal signal of the latch module 1015 is connected with a high level, the output terminal of the latch module 1015 outputs a low level.

The function of the latch and step-down module 1016 is described as follows: when the first input terminal of the latch and step-down module 1016 is at a low level, the second output terminal of the latch and step-down module 1016 continuously outputs a high level; when the second input terminal of the latch and step-down module 1016 is at a low level, the second output terminal of the latch and step-down module 1016 continuously outputs a low level. That is, the two pulse signals decomposed by the HIN1 signal at the two output terminals of the first input sub-circuit 1011 are re-integrated into a complete signal, and since the latch and step-down module 1016 inside includes a step-down circuit, the second output terminal of the latch and step-down module 1016 outputs a voltage of 3V to VS1.

The function of the first output sub-circuit 1017 is described as follows: the first output sub-circuit 1017 can output a signal whose voltage value is consistent with the positive terminal of the power supply when at a high level, and the first output sub-circuit 1017 can output a signal whose voltage value is consistent with the negative terminal of the power supply and whose phase is consistent with that of the HIN1 terminal when at a low level.

Thus, the first switch tube 1012, the second switch tube 1013 and the third switch tube 1014 are controlled by a narrow pulse signal of 300 ns; therefore, the conduction time of the first switch tube 1012, the second switch tube 1013 and the third switch tube 1014 can be shortened and the power consumption is reduced.

After the HIN1 terminal signal passes through the first input sub-circuit 1011, the first output terminal of the first input sub-circuit 1011 outputs a 300 ns narrow pulse when the signal is at the rising edge and the second output terminal of the first input sub-circuit 1011 outputs a 300 ns narrow pulse when the signal is at the falling edge. The narrow pulse controls each of the first switch tube 1012 and the second switch tube 1013 to turn on 300 ns, and thus the first input terminal and the second input terminal of the latch and step-down module 1016 respectively generate a low level of 300 ns. The latch and step-down module 1016 inside has an RS flip-flop or the like device, so that the two low level signals are re-integrated into a complete signal which is in phase with the HIN1. When the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) include a GaN MOS tube (that is, the upper bridge arm switch tube and the lower bridge arm switch tube each are the GaN MOS mode in FIG. 2, the combination mode of GaN MOS and Si FRD in FIG. 3, or the combination mode of GaN MOS and GaN SBD in FIG. 4) and the control input terminal SS is connected with a high level, the third output terminal of the first input sub-circuit 1011 generates a high-level pulse. Thus, the third switch tube 1014 is turned on for 300 ns, the input terminal of the latch module 1015 generates a low level of 300 ns, the output terminal of the latch module 1015 outputs a high level, and thus the positive terminal of the power supply of the first output sub-circuit 1017 switches to be connected to the selection terminal 1 of the first switching module 1018, that is, connected to the first output terminal of the latch and step-down module 1016. Thereby, the P-HO1 terminal and the N-HO1 terminal of the first output sub-circuit 1017 respectively output 0V and 3V of high/low level signals.

When the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) do not include a GaN MOS tube (that is, the upper bridge arm switch tube and the lower bridge arm switch tube each are the combination mode of Si IGBT and Si FRD in FIG. 5, or the combination mode of Si IGBT and GaN SBD in FIG. 6) and the control input terminal SS is connected with a low level, the third output terminal of the first input sub-circuit 1011 does not generate a high-level pulse. Thereby, the third switch tube 1014 is turned off, the input terminal of the latch module 1015 does not generate a low level, the output terminal of the latch module 1015 outputs a low level, and thus the positive terminal of the power supply of the first output sub-circuit 1017 is kept connected to the selection terminal 0 of the first switching module 1018 and connected to the VB1. Thus, the first output sub-circuit 1017 outputs 0V to 15V of high/low level signal.

Figure 13:
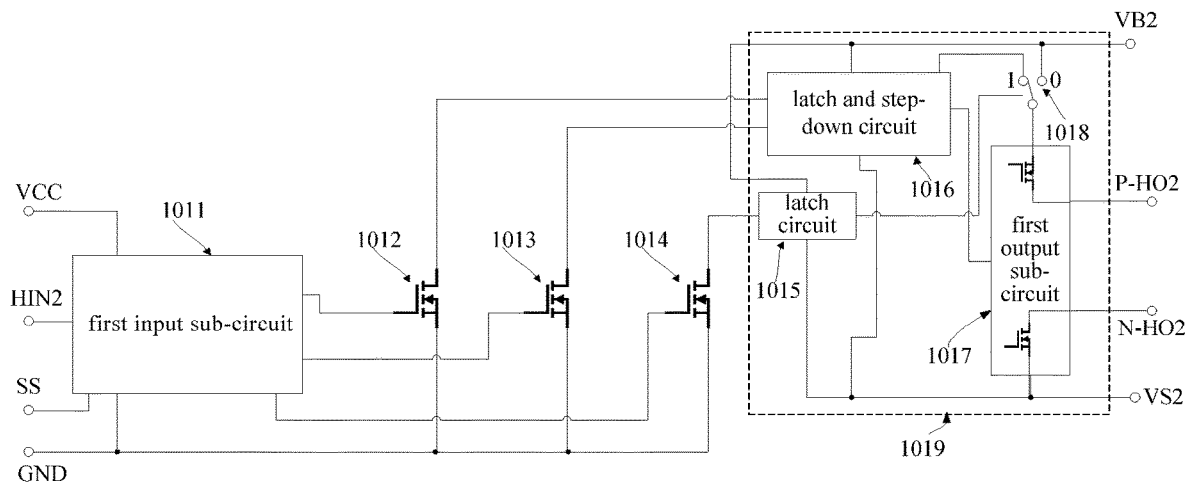
FIG. 13 is a schematic diagram of a VH driving circuit according to an embodiment of the present disclosure.
Figure 14:
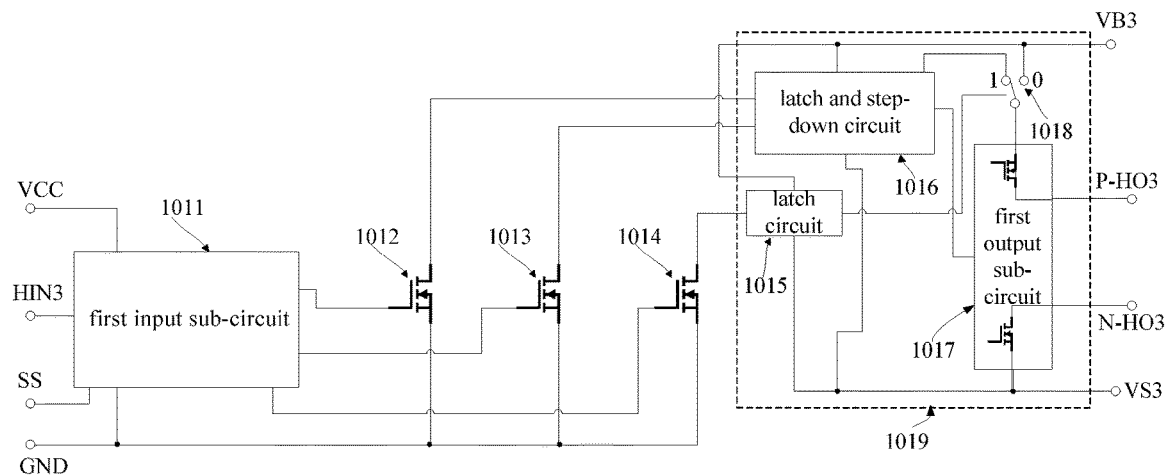
FIG. 14 is a schematic diagram of a WH driving circuit according to an embodiment of the present disclosure.

Referring to FIGS. 13 and 14, the structures of the VH driving circuit 102 and the WH driving circuit 103 are the same as the structure of the UH driving circuit 101, and description thereof is not repeated.

Figure 15:
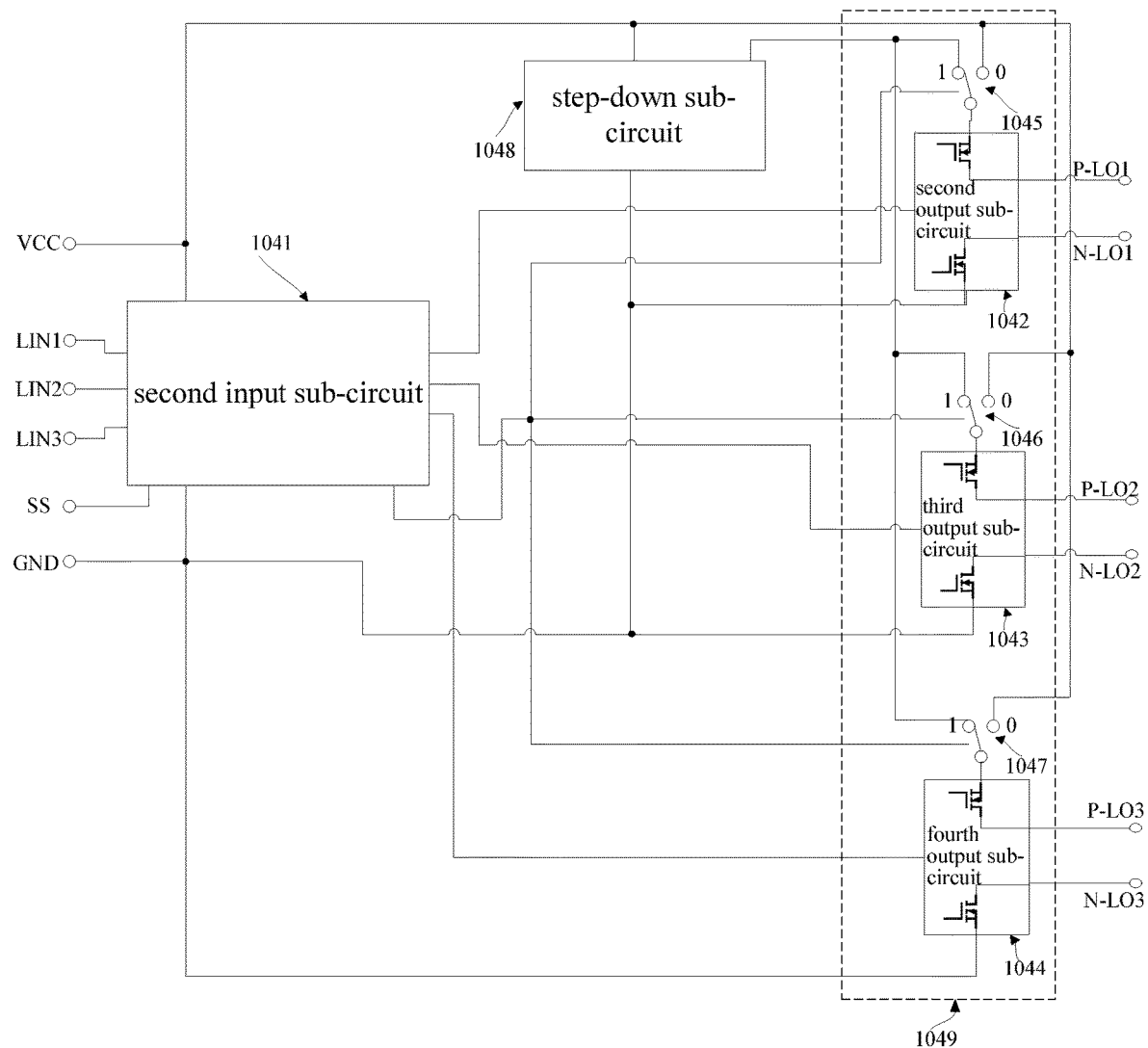
FIG. 15 is a schematic diagram of a UL/VL/WL driving circuit according to an embodiment of the present disclosure.

Referring to FIG. 15, the UL/VL/WL driving circuit 104 inside includes a second input sub-circuit 1041, a second voltage output sub-circuit 1049 and a step-down sub-circuit 1048. The second voltage output sub-circuit 1049 is connected to the second input sub-circuit 1041 and the step-down sub-circuit 1048. The second input sub-circuit 1041 includes a first output terminal, a second output terminal, a third output terminal, and a fourth output terminal. The function of the second input sub-circuit 1041 is described as follows: the first output terminal of the second input sub-circuit 1041 outputs a signal which is in phase with that of the first input terminal of the second input sub-circuit 1041; the second output terminal of the second input sub-circuit 1041 outputs a signal which is in phase with that of the second input terminal of the second input sub-circuit 1041; and the third output terminal of the second input sub-circuit 1041 outputs a signal which is in phase with that of the third input terminal of the second input sub-circuit 1041. When the SS terminal of the second input sub-circuit 1041 is at a high level, the fourth output terminal of the second input sub-circuit 1041 outputs a high level. When the SS terminal of the second input sub-circuit 1041 is at a low level, the fourth output terminal of the second input sub-circuit 1041 outputs a low level.

The second voltage output sub-circuit 1049 includes a UL (first phase lower) output module 1042, a VL (second phase lower) output module 1043, a WL (third phase lower) output module 1044, a second switching module 1045, a third switching module 1046, and a fourth switching module 1047. The UL output module 1042 is connected to the second switching module 1045 and the first output terminal of the second input sub-circuit 1041. The VL output module 1043 is connected to the third switching module 1046 and the second output terminal of the second input sub-circuit 1041. The WL output module 1044 is connected to the fourth switching module 1047 and the third output terminal of the second input sub-circuit 1041. The control terminal of the second switching module 1045, the control terminal of the third switching module 1046, and the control terminal of the fourth switching module 1047 are each connected to the fourth output terminal of the second input sub-circuit 1041.

The output terminal of the step-down sub-circuit 1048 is connected to the selection terminal 1 of the second switching module 1045, the selection terminal 1 of the third switching module 1046, and the selection terminal 1 of the fourth switching module 1047. The P-LO1 and N-LO1 are respectively connected to emitters of PMOS and NMOS of the UL output module 1042, the P-LO2 and N-LO2 are respectively connected to emitters of PMOS and NMOS of the VL output module 1043, and the P-LO3 and N-LO3 are respectively connected to emitters of PMOS and NMOS of the WL output module 1044.

The step-down sub-circuit 1048 can step down the power supply voltage (15V) to the first voltage range (0V to 3V). That is, the second switching module 1045, the third switching module 1046 and the fourth switching module 1047 select the power supply voltage or the output voltage of the step-down sub-circuit 1048 as the output voltage of the second voltage output sub-circuit based on the fourth output terminal of the second input sub-circuit 1041. The step-down sub-circuit 1048 can output a voltage of 3V to GND at the output terminal of the step-down sub-circuit 1048. The UL output module 1042 can output a signal whose voltage value is consistent with the positive terminal of its power supply when at a high level, and the UL output module 1042 can output a signal whose voltage value is consistent with the negative terminal of its power supply and whose phase is consistent with the LIN1 when at a low level. The VL output module 1043 can output a signal whose voltage value is consistent with the positive terminal of its power supply when at a high level, and the VL output module 1043 can output a signal whose voltage value is consistent with the negative terminal of its power supply and whose phase is consistent with the LIN2 when at a low level. The WL output module 1044 can output a signal whose voltage value is consistent with the positive terminal of its power supply when at a high level, and the WL output module 1044 can output a signal whose voltage value is consistent with the negative terminal of its power supply and whose phase is consistent with the LIN3 when at a low level.

Among them, the VCC terminal is connected to the positive terminal of the power supply of the second input sub-circuit 1041, the positive terminal of the power supply of the step-down sub-circuit 1048, the selection terminal 0 of the second switching module 1045 (such as an analog switch), the selection terminal 0 of the third switching module 1046 (such as an analog switch), and the selection terminal 0 of the fourth switching module 1047 (such as an analog switch). The LIN1 terminal is connected to the first input terminal of the second input sub-circuit 1041. The LIN2 terminal is connected to the second input terminal of the second input sub-circuit 1041. The LIN3 terminal is connected to the third input terminal of the second input sub-circuit 1041. The control input terminal SS is connected to the control terminal of the second input sub-circuit 1041. The first output terminal of the second input sub-circuit 1041 is connected to the input terminal of the UL output module 1042. The second output terminal of the second input sub-circuit 1041 is connected to the input terminal of the VL output module 1043. The third output terminal of the second input sub-circuit 1041 is connected to the input terminal of the VL output module 1043.

The GND is connected to the negative terminal of the power supply of the second input sub-circuit 1041, the negative terminal of the power supply of the step-down sub-circuit 1048, the negative terminal of the power supply of the UL output module 1042, the negative terminal of the power supply of the VL output module 1043, and the negative terminal of the power supply of the WL output module 1044.

The working principle of the UL/VL/WL driving circuit 104 is described as follows: after signals of the LIN1 terminal, the LIN2 terminal and the LIN3 terminal pass through the second input sub-circuit 1041, the first output terminal, the second output terminal and the third output terminal of the second input sub-circuit 1041 respectively output signals which are in phase with that of the LIN1 terminal, the LIN2 terminal and the LIN3 terminal, in which the signals are shaped into a square wave.

When the control input terminal SS is at a high level, the first output terminal, the second output terminal, the third output terminal and the fourth output terminal of the second input sub-circuit 1041 each output trigger pulses which are a high level, and the second voltage output sub-circuit 1049 outputs a high/low level signal in the first voltage range (0V-3V). When the control input terminal SS is at a low level, the first output terminal, the second output terminal and the third output terminal of the second input sub-circuit 1041 each output trigger pulses which are a high level, the fourth output terminal of the second input sub-circuit 1041 outputs a low level, and the second voltage output sub-circuit 1049 outputs a high/low level signal in the second voltage range (0V-15V).

For example, when the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) each include a GaN MOS tube (that is, the upper bridge arm switch tube and the lower bridge arm switch tube each are the GaN MOS mode in FIG. 2, a combination mode of GaN MOS and Si FRD in FIG. 3, or a combination mode of GaN MOS and GaN SBD in FIG. 4) and the control input terminal SS is connected with a high level, the fourth output terminal of the second input sub-circuit 1041 outputs a high level. A fixed terminal of the second switching module 1045 is connected to the selection terminal 1 of the second switching module 1045. A fixed terminal of the third switching module 1046 is connected to the selection terminal 1 of the third switching module 1046. A fixed terminal of the fourth switching module 1047 is connected to the selection terminal 1 of the fourth switching module 1047. Thus, the P-LO1 and N-LO1 output 0V and 3V of signals that are in phase with the input terminal of the UL output module 1042. The P-LO2 and N-LO2 output 0V and 3V of signals that are in phase with the input terminal of the VL output module 1043. The P-LO3 and N-LO3 output 0V and 3V of signals that are in phase with the input terminal of the WL output module 1044.

When the upper bridge arm switch tube (the first upper bridge arm switch tube 121, the second upper bridge arm switch tube 122 and the third upper bridge arm switch tube 123) and the lower bridge arm switch tube (the first lower bridge arm switch tube 124, the second lower bridge arm switch tube 125 and the third lower bridge arm switch tube 126) each do not include a GaN MOS tube (that is, the upper bridge arm switch tube and the lower bridge arm switch tube each are a combination mode of Si IGBT and Si FRD in FIG. 5, or a combination mode of Si IGBT and GaN SBD in FIG. 6) and the control input terminal SS is connected with a low level, the fourth output terminal of the second input sub-circuit 1041 outputs a low level. A fixed terminal of the second switching module 1045 is connected to the selection terminal 0 of the second switching module 1045. A fixed terminal of the third switching module 1046 is connected to the selection terminal 0 of the third switching module 1046. A fixed terminal of the fourth switching module 1047 is connected to the selection terminal 0 of the fourth switching module 1047. Thus, the P-LO1 and N-LO1 output 0V and 15V of signals that are in phase with the input terminal of the UL output module 1042. The P-LO2 and N-LO2 output 0V and 15V of signals that are in phase with the input terminal of the VL output module 1043. The P-LO3 and N-LO3 output 0V and 15V of signals that are in phase with the input terminal of the WL output module 1044.

Figure 16:
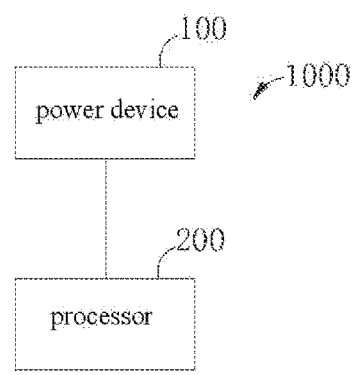
FIG. 16 is a schematic diagram of the modules of an electrical appliance according to an embodiment of the present disclosure.

Referring to FIGS. 1 and 16, the present disclosure in certain embodiments also proposes an electrical appliance 1000. The electrical appliance 1000 includes the power device 100 described above and the processor 200. The processor 200 is connected to the power device 100. The electrical appliance 1000 may be an air conditioner (including a household air conditioner, a commercial air conditioner), a washing machine, a refrigerator, an induction cooker, or the like. The power device 100 can implement the functions as described above.

The electrical appliance 1000 in certain embodiments of the present disclosure controls the control input terminal SS of the HVIC tube 111 to be connected with a high level or a low level. When the control input terminal SS is connected with a high level, the first driving circuit 105 and the second driving circuit 106 output a high/low level signal in a first voltage range to ensure that the GaN device is fully turned on and the gate of GaN device is not broken down. When the control input terminal SS is connected with a low level, the first driving circuit 105 and the second driving circuit 106 output a high/low level signal in a second voltage range different from the first voltage range to ensure that the Si device is fully turned on. Thereby, the adaptability of the GaN intelligent power module and the Si intelligent power module is improved, which ensures the functions of the GaN and Si intelligent power modules to be executed. In addition, the power supply voltage of the power device 100 remains unchanged at 15V and the peripheral circuit does not need to be modified, thus the power consumption of the HVIC tube 111 does not substantially increase. A same HVIC tube 111 drives the GaN device and the Si device; thus, there is no risk of mixing the HVIC tubes 111 during the production process, which facilitates material organization and reduces material costs.

Although the preferred embodiments of the present disclosure have been described, those skilled in the art can make additional changes and modifications to these embodiments once they learn the basic creative concept. Therefore, the appended claims are intended to be interpreted as including the preferred embodiments and all changes and modifications falling within the scope of the present disclosure.

Obviously, those skilled in the art can make various changes and modifications to the present disclosure without departing from the spirit and scope of the present disclosure. Thus, if these modifications and variations of the present disclosure fall within the scope of the claims of the present disclosure and their equivalent technologies, the present disclosure is also intended to include these modifications and variations.

What is claimed is:

1. A power device comprising:
a control input terminal;
an upper bridge arm switch tube and a lower bridge arm switch tube;
an upper resistor group and a lower resistor group;
a first driving circuit, connected to the control input terminal and the upper bridge arm switch tube through the upper resistor group; and
a second driving circuit, connected to the control input terminal and the lower bridge arm switch tube through the lower resistor group,
wherein:
the control input terminal is connectable to a high level or a low level,
when the control input terminal is connected to the high level, the first driving circuit and the second driving circuit output a high/low level signal in a first voltage range,
when the control input terminal is connected to the low level, the first driving circuit and the second driving circuit output a high/low level signal in a second voltage range, and
the first voltage range is different from the second voltage range, and
wherein:
when the upper bridge arm switch tube and the lower bridge arm switch tube each comprise a GaN device, a high level is input to the control input terminal, and
when the upper bridge arm switch tube and the lower bridge arm switch tube each comprise a Si device, a low level is input to the control input terminal.

2. The power device according to claim 1, further comprising a GND terminal and a VCC terminal, wherein:
when the control input terminal is connected to the GND terminal, the control input terminal is connected to the low level, and
when the control input terminal is connected to the VCC terminal, the control input terminal is connected to the high level.

3. The power device according to claim 1, further comprising a controller, wherein:
the control input terminal is connected to the controller, and
the controller is configured to control the control input terminal to be connected to the high level or the low level.

4. The power device according to claim 1, wherein the first voltage range is in the range of 0V to 3V and the second voltage range is in the range of 0V to 15V.

5. The power device according to claim 1, wherein:
the first driving circuit comprises a first phase upper driving circuit, a second phase upper driving circuit and a third phase upper driving circuit;
the second driving circuit comprises a lower driving circuit;
the upper bridge arm switch tube comprises a first upper bridge arm switch tube, a second upper bridge arm switch tube and a third upper bridge arm switch tube;
the lower bridge arm switch tube comprises a first lower bridge arm switch tube, a second lower bridge arm switch tube and a third lower bridge arm switch tube;
the upper resistor group comprises a first upper switch resistor, a second upper switch resistor and a third upper switch resistor; and
the lower resistor group comprises a first lower switch resistor, a second lower switch resistor and a third lower switch resistor,
wherein:
the control input terminal is connected to each of the first phase upper driving circuit, the second phase driving circuit and the third phase upper driving circuit,
the first phase upper driving circuit is connected to and configured to drive the first upper bridge arm switch tube through the first upper switch resistor,
the second phase upper driving circuit is connected to and configured to drive the second upper bridge arm switch tube through the second upper switch resistor, and
the third phase upper driving circuit is connected to and configured to drive the third upper bridge arm switch tube through the third upper switch resistor, and
wherein:
the control input terminal is connected to the lower driving circuit,
the lower driving circuit is connected to and configured to drive the first lower bridge arm switch tube through the first lower switch resistor,
the lower driving circuit is connected to and configured to drive the second lower bridge arm switch tube through the second lower switch resistor, and
the lower driving circuit is connected to and configured to drive the third lower bridge arm switch tube through the third lower switch resistor.

6. The power device according to claim 5, wherein the first phase upper driving circuit, the second phase upper driving circuit or the third phase upper driving circuit comprises:
a first input sub-circuit, connected to the control input terminal and comprising a first output terminal, a second output terminal and a third output terminal,
wherein:
when the control input terminal is connected to the low level, the first output terminal and the second output terminal output trigger pulses, and
when the control input terminal is connected to the high level, the first output terminal, the second output terminal and the third output terminal output trigger pulses;
a first switch tube, a second switch tube and a third switch tube,
wherein:
the first switch tube is connected to the first output terminal, when the first output terminal outputs a trigger pulse, the first switch tube is turned on,
the second switch tube is connected to the second output terminal, when the second output terminal outputs a trigger pulse, the second switch tube is turned on, and
the third switch tube is connected to the third output terminal, when the third output terminal outputs a trigger pulse, the third switch tube is turned on; and
a first voltage output sub-circuit, connected to each of the first switch tube, the second switch tube and the third switch tube,
wherein:
the first voltage output sub-circuit outputs the high/low level signal in the second voltage range when the third switch tube is not turned on, and
the first voltage output sub-circuit outputs the high/low level signal in the first voltage range when the third switch tube is turned on.

7. The power device according to claim 6, wherein the first voltage output sub-circuit comprises:
a latch and step-down circuit, connected to the first switch tube and the second switch tube,
a first switching module, connected to the latch and step-down circuit and a power supply respectively, and
a latch circuit, connected to the third switch tube,
wherein:
when the third switch tube is not turned on, the latch circuit is configured to control an action of the first switching module to take a voltage of the power supply as an output voltage of the first voltage output sub-circuit; and
when the third switch tube is turned on, the latch circuit is configured to control an action of the first switching module to take an output voltage of the latch and step-down circuit as an output voltage of the first voltage output sub-circuit.

8. The power device according to claim 5, wherein the lower driving circuit comprises:
a second input sub-circuit, comprising a first output terminal, a second output terminal, a third output terminal and a fourth output terminal,
wherein:
when the control input terminal is connected to the high level, the first output terminal, the second output terminal, the third output terminal and the fourth output terminal output trigger pulses, and
when the control input terminal is connected to the low level, the first output terminal, the second output terminal and the third output terminal output trigger pulses;
a step-down sub-circuit, configured to step-down a voltage of a power supply to the first voltage range; and
a second voltage output sub-circuit, connected to the second input sub-circuit and the step-down sub-circuit, wherein:
when the first output terminal, the second output terminal, the third output terminal and the fourth output terminal output trigger pulses, the second voltage output sub-circuit outputs the high/low level signal in the first voltage range, and
when the first output terminal, the second output terminal and the third output terminal output trigger pulses, the second voltage output sub-circuit outputs the high/low level signal in the second voltage range.

9. The power device according to claim 8, wherein the second voltage output sub-circuit comprises:
a first phase lower output module, a second phase lower output module and a third phase lower output module, respectively connected to the first output terminal, the second output terminal and the third output terminal of the second input sub-circuit,
a second switching module, a third switching module and a fourth switching module, respectively connected to the first phase lower output module, the second phase lower output module and the third phase lower output module,
wherein:
the second switching module, the third switching module and the fourth switching module are configured to select the voltage of the power supply or an output voltage of the step-down sub-circuit as an output voltage of the second voltage output sub-circuit according to the fourth output terminal of the second input sub-circuit.

10. An electrical appliance comprising:
a power device and a processor connected to the power device,
wherein the power device comprises:
a control input terminal;
an upper bridge arm switch tube and a lower bridge arm switch tube;
an upper resistor group and a lower resistor group;
a first driving circuit, connected to the control input terminal and connected to the upper bridge arm switch tube through the upper resistor group; and
a second driving circuit, connected to the control input terminal and connected to the lower bridge arm switch tube through the lower resistor group,
wherein:
the control input terminal is connectable to a high level or a low level,
when the control input terminal is connected to the high level, the first driving circuit and the second driving circuit output a high/low level signal in a first voltage range, and
when the control input terminal is connected to the low level, the first driving circuit and the second driving circuit output a high/low level signal in a second voltage range,
wherein the first voltage range is different from the second voltage range, and
wherein:
when the upper bridge arm switch tube and the lower bridge arm switch tube each comprise a GaN device, a high level is input to the control input terminal, and
when the upper bridge arm switch tube and the lower bridge arm switch tube each comprise a Si device, a low level is input to the control input terminal.

11. The electrical appliance according to claim 10, wherein:
the power device further comprises a GND terminal and a VCC terminal,
when the control input terminal is connected to the GND terminal, the control input terminal is connected to the low level, and
when the control input terminal is connected to the VCC terminal, the control input terminal is connected to the high level.

12. The electrical appliance according to claim 10, wherein the power device further comprises a controller, wherein:
the control input terminal is connected to the controller, and
the controller is configured to control the control input terminal to be connected to the high level or the low level.

13. The electrical appliance according to claim 10, wherein the first voltage range is the range of 0V to 3V and the second voltage range is the range of 0V to 15V.

14. The electrical appliance according to claim 10, wherein:
the first driving circuit comprises a first phase upper driving circuit, a second phase upper driving circuit and a third phase upper driving circuit;
the second driving circuit comprises a lower driving circuit;
the upper bridge arm switch tube comprises a first upper bridge arm switch tube, a second upper bridge arm switch tube and a third upper bridge arm switch tube;

the lower bridge arm switch tube comprises a first lower bridge arm switch tube, a second lower bridge arm switch tube and a third lower bridge arm switch tube;

the upper resistor group comprises a first upper switch resistor, a second upper switch resistor and a third upper switch resistor; and the lower resistor group comprises a first lower switch resistor, a second lower switch resistor and a third lower switch resistor, wherein:

the control input terminal is connected to each of the first phase upper driving circuit, the second phase upper driving circuit and the third phase upper driving circuit, the first phase upper driving circuit is connected to and configured to drive the first upper bridge arm switch tube through the first upper switch resistor, the second phase upper driving circuit is connected to and configured to drive the second upper bridge arm switch tube through the second upper switch resistor, and the third phase upper driving circuit is connected to and configured to drive the third upper bridge arm switch tube through the third upper switch resistor, and wherein:

the control input terminal is connected to the lower driving circuit, the lower driving circuit is connected to and configured to drive the first lower bridge arm switch tube through the first lower switch resistor, the lower driving circuit is connected to and configured to drive the second lower bridge arm switch tube through the second lower switch resistor, and the lower driving circuit is connected to and configured to drive the third lower bridge arm switch tube through the third lower switch resistor.

15. The electrical appliance according to claim 14, wherein the first phase upper driving circuit, the second phase upper driving circuit or the third phase upper driving circuit comprises:

a first input sub-circuit, connected to the control input terminal and comprising a first output terminal, a second output terminal and a third output terminal, wherein:

when the control input terminal is connected to the low level, the first output terminal and the second output terminal output trigger pulses, and when the control input terminal is connected to the high level, the first output terminal, the second output terminal and the third output terminal output trigger pulses;

a first switch tube, a second switch tube and a third switch tube, wherein:

the first switch tube is connected to the first output terminal, when the first output terminal outputs a trigger pulse, the first switch tube is turned on, the second switch tube is connected to the second output terminal, when the second output terminal outputs a trigger pulse, the second switch tube is turned on, and the third switch tube is connected to the third output terminal, when the third output terminal outputs a trigger pulse, the third switch tube is turned on; and a first voltage output sub-circuit, connected to each of the first switch tube, the second switch tube and the third switch tube, wherein:

the first voltage output sub-circuit outputs the high/low level signal in the second voltage range when the third switch tube is not turned on, and the first voltage output sub-circuit outputs the high/low level signal in the first voltage range when the third switch tube is turned on.

16. The electrical appliance according to claim 15, wherein the first voltage output sub-circuit comprises:

a latch and step-down circuit, connected to the first switch tube and the second switch tube, a first switching module, connected to the latch and step-down circuit and a power supply respectively, and a latch circuit, connected to the third switch tube, wherein:

when the third switch tube is not turned on, the latch circuit is configured to control an action of the first switching module to take a voltage of the power supply as an output voltage of the first voltage output sub-circuit; and when the third switch tube is turned on, the latch circuit is configured to control an action of the first switching module to take an output voltage of the latch and step-down circuit as an output voltage of the first voltage output sub-circuit.

17. The electrical appliance according to claim 14, wherein the lower driving circuit comprises:

a second input sub-circuit, comprising a first output terminal, a second output terminal, a third output terminal and a fourth output terminal, wherein:

when the control input terminal is connected to the high level, the first output terminal, the second output terminal, the third output terminal and the fourth output terminal output trigger pulses, and when the control input terminal is connected to the low level, the first output terminal, the second output terminal and the third output terminal output trigger pulses;

a step-down sub-circuit, configured to step-down a voltage of a power supply to the first voltage range; and a second voltage output sub-circuit, connected to the second input sub-circuit and the step-down sub-circuit, wherein:

when the first output terminal, the second output terminal, the third output terminal and the fourth output terminal output trigger pulses, the second voltage output sub-circuit outputs the high/low level signal in the first voltage range, and when the first output terminal, the second output terminal and the third output terminal output trigger pulses, the second voltage output sub-circuit outputs the high/low level signal in the second voltage range.

18. The electrical appliance according to claim 17, wherein the second voltage output sub-circuit comprises:

a first phase lower output module, a second phase lower output module and a third phase lower output module, respectively connected to the first output terminal, the second output terminal and the third output terminal of the second input sub-circuit, and a second switching module, a third switching module and a fourth switching module, respectively connected to the first phase lower output module, the second phase lower output module and the third phase lower output module, wherein:

the second switching module, the third switching module and the fourth switching module select the voltage of the power supply or an output voltage of the step-down sub-circuit as an output voltage of the second voltage output sub-circuit according to the fourth output terminal of the second input sub-circuit.

\* \* \* \* \*